US008728719B2

(12) United States Patent
Bayramian et al.

(10) Patent No.: US 8,728,719 B2
(45) Date of Patent: May 20, 2014

(54) DIFFRACTIVE LASER BEAM HOMOGENIZER INCLUDING A PHOTO-ACTIVE MATERIAL AND METHOD OF FABRICATING THE SAME

(75) Inventors: Andy J. Bayramian, Manteca, CA (US); Christopher A. Ebbers, Pleasanton, CA (US); Diana C. Chen, Fremont, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 539 days.

(21) Appl. No.: 12/544,161

(22) Filed: Aug. 19, 2009

(65) Prior Publication Data
US 2011/0043917 A1 Feb. 24, 2011

(51) Int. Cl.
G03F 7/00 (2006.01)
G02B 27/09 (2006.01)

(52) U.S. Cl.
CPC .............. *G03F 7/00* (2013.01); *G02B 27/0961* (2013.01); *G02B 27/0927* (2013.01); *G02B 27/0922* (2013.01)
USPC .......................................... 430/321; 359/569

(58) Field of Classification Search
None
See application file for complete search history.

(56) References Cited

U.S. PATENT DOCUMENTS

| 4,336,978 | A | * | 6/1982 | Suzuki ........................... 359/599 |
| 4,427,265 | A | * | 1/1984 | Suzuki et al. .................. 359/599 |
| 4,514,053 | A | * | 4/1985 | Borrelli et al. ................. 359/569 |
| 4,547,037 | A | | 10/1985 | Case |
| 4,567,123 | A | * | 1/1986 | Ohtaka et al. ..................... 430/4 |
| 4,572,611 | A | * | 2/1986 | Bellman et al. ................. 399/218 |
| 5,307,365 | A | | 4/1994 | Stappaerts et al. |
| 5,534,386 | A | * | 7/1996 | Petersen et al. ................. 430/320 |
| 5,610,733 | A | | 3/1997 | Feldman et al. |
| 5,615,022 | A | * | 3/1997 | Brandstetter et al. ........... 359/12 |
| 5,787,107 | A | | 7/1998 | Leger et al. |

(Continued)

FOREIGN PATENT DOCUMENTS

| JP | 06-118863 | * | 4/1994 |
| JP | 06-235808 | * | 8/1994 |

(Continued)

OTHER PUBLICATIONS

Mihailov et al., "Apodization technique for fiber grating fabrication with a halftone transmission amplitude mask", Appl. Opt., vol. 39(21) pp. 3670-3677 (Jul. 2000).*

(Continued)

*Primary Examiner* — Martin Angebranndt
(74) *Attorney, Agent, or Firm* — Kilpatrick Townsend & Stockton (57) ABSTRACT

A method of manufacturing a plurality of diffractive optical elements includes providing a partially transmissive slide, providing a first piece of PTR glass, and directing first UV radiation through the partially transmissive slide to impinge on the first piece of PTR glass. The method also includes exposing predetermined portions of the first piece of PTR glass to the first UV radiation and thermally treating the exposed first piece of PTR glass. The method further includes providing a second piece of PTR glass and directing second UV radiation through the thermally treated first piece of PTR glass to impinge on the second piece of PTR glass. The method additionally includes exposing predetermined portions of the second piece of PTR glass to the second UV radiation, thermally treating the exposed second piece of PTR glass, and repeating providing and processing of the second piece of PTR glass using additional pieces of PTR glass.

13 Claims, 7 Drawing Sheets

(56) References Cited

U.S. PATENT DOCUMENTS

| | | | |
|---|---|---|---|
| 5,796,521 A | | 8/1998 | Kahlert et al. |
| 5,896,208 A | * | 4/1999 | Dausmann et al. ............... 359/2 |
| 5,999,281 A | * | 12/1999 | Abbott et al. ................... 359/15 |
| 6,215,598 B1 | | 4/2001 | Hwu |
| 6,574,395 B1 | * | 6/2003 | Mechin et al. ................. 385/37 |
| 6,700,709 B1 | | 3/2004 | Fermann |
| 6,707,956 B1 | * | 3/2004 | Kim et al. ....................... 385/10 |
| 6,738,407 B2 | | 5/2004 | Hirano et al. |
| 7,551,818 B2 | | 6/2009 | Okorogu |
| 2001/0008466 A1 | * | 7/2001 | Kim et al. ..................... 359/566 |
| 2002/0191236 A1 | * | 12/2002 | King ............................... 359/10 |
| 2003/0107787 A1 | * | 6/2003 | Bablumyan ..................... 359/15 |
| 2003/0207747 A1 | * | 11/2003 | Wu et al. ......................... 501/56 |
| 2003/0219205 A1 | * | 11/2003 | Volodin et al. ................. 385/37 |
| 2004/0126698 A1 | * | 7/2004 | Borrelli et al. ............. 430/270.1 |
| 2006/0045144 A1 | | 3/2006 | Karlsen et al. |
| 2006/0171033 A1 | * | 8/2006 | Schreder et al. ............. 359/566 |
| 2007/0223093 A1 | | 9/2007 | Ushiro et al. |
| 2007/0273957 A1 | | 11/2007 | Zalevsky et al. |
| 2009/0190214 A1 | * | 7/2009 | Borrelli et al. ................ 359/486 |
| 2011/0043900 A1 | * | 2/2011 | Bayramian ................... 359/349 |

FOREIGN PATENT DOCUMENTS

| | | |
|---|---|---|
| JP | 2007-121941 A | 5/2007 |
| JP | 2008-170471 A | 7/2008 |
| WO | WO 99/39410 A1 | 8/1999 |
| WO | WO 00/21165 A1 | 4/2000 |
| WO | WO 2005/036211 A2 | 4/2005 |

OTHER PUBLICATIONS

Smirnov et al. "Adjustable diffraction filter for high power lasers", Proc. CLEO 03, 2 pages (2003).*

Sinzinger et al., "Astigmatic gradiaent index elements for laser-diode collimation and beams shaping", Appl. Opt., vol. 34(29) pp. 6626-6632 (Oct. 1995).*

Extended European Search Report of European Patent Application No. 10008684, mailed Dec. 27, 2010, 7 pages total.

Kopp et al., "Efficient beamshaper homogenizer design combining diffractive optical elements, microlens array and random phase plate," J. Opt. A: Pure Appl. Opt. 1999; 1:398-403.

Overton, "Laser Beam Shaping: Diode-laser system yields 11kW homogenized output," Laser Focus World, May 2007; can be retrieved from the Internet: <<http://www.dilas.com/gdresources/downloads/mediacoverage/DILAS_LaserBeam_Shaping_LFW_0520071.pdf>>.

Rudnaya et al., "Rational design of a diffractive homogenizer for a laser beam" J Engineering Mathematics, 2002; 43:189-199.

Schwartz, *Encyclopedia of Smart Materials: vol. 2*, 2002 John Wiley & Sons, pp. 770-780.

Suss MicroOptics SA Catalog 2007: MicroLens Arrays, Feb. 2007, 16 pages total.

Efimov et al., "Diffractive optical elements in photosensitive inorganic glasses," SPIEL Proc., 2001; 4452:39-47.

Kukhtarev et al., "Laser Beam Shaping by Holographic Optical Elements," SPIEL Proc., 2003; 5257:152-162.

Partial European Search Report of Patent Application No. 10008683.4, mailed Dec. 27, 2010, 7 pages total.

* cited by examiner

DIFFRACTIVE LASER BEAM HOMOGENIZER INCLUDING A PHOTO-ACTIVE MATERIAL AND METHOD OF FABRICATING THE SAME

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

CROSS-REFERENCES TO RELATED APPLICATIONS

The following two regular U.S. patent applications (including this one) were filed concurrently, and the entire disclosure of U.S. application Ser. No. 12/544,161, is incorporated by reference into this application for all purposes:
  application Ser. No. 12/544,147, filed Aug. 19, 2009, entitled "Method and System for Homogenizing Diode Laser Pump Arrays"; and
  application Ser. No. 12/544,161, filed Aug. 19, 2009, entitled "Diffractive Laser Beam Homogenizer including a Photo-Active Material and Method of Fabricating the Same"

BACKGROUND OF THE INVENTION

High average power diode pumped solid state lasers often have beam modulation or non-uniform spatial profiles in the near field and can have a Gaussian or multi-peaked far field. Several important laser applications including pumping other lasers, machining, laser shock generation, and laser ablation require a flat spatial profile either in the near field or the far field.

Figure 1:
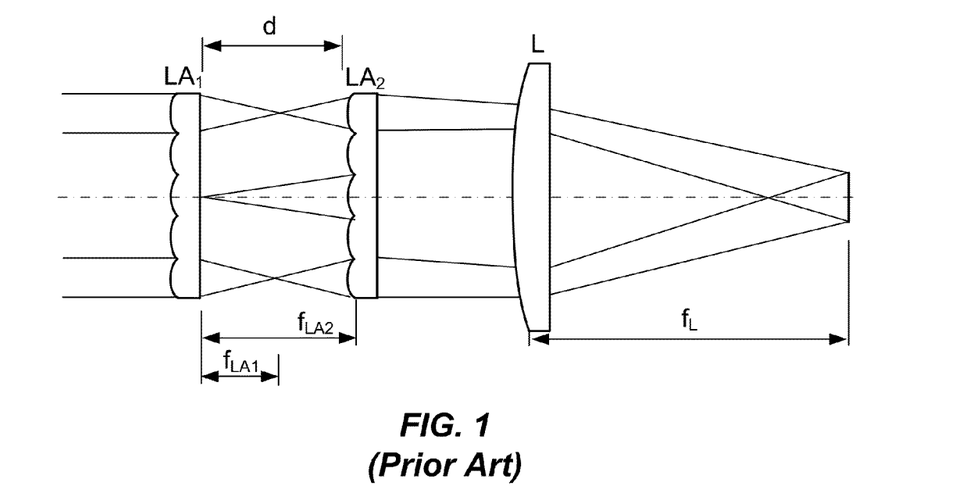
FIG. 1 is a simplified drawing of a conventional microlens array beam homogenizer.

Video projectors utilize beam homogenizers in order to provide images with uniform intensity as a function of screen position. Typically, these beam homogenizers are lens based homogenizers. FIG. 1 is a simplified drawing of a conventional microlens array beam homogenizer. As illustrated in FIG. 1, a first two-dimensional square array of microlenses $LA_1$ is positioned a predetermined distance d from a second two-dimensional square array of microlenses $LA_2$. The microlens arrays are plano-convex with parabolic lens profiles. The distance d is equal to the focal length of the second two-dimensional square array of microlenses $f_{LA2}$. The first two-dimensional square array of microlenses $LA_1$ focus incoming collimated light at a distance equal to $f_{LA1}$. Light from each of the microlenses in the first array is thus spread to several microlenses at corresponding adjacent positions in the second array. The output of the second two-dimensional square array of microlenses $LA_2$ is a collimated and uniform beam that can be focused by lens L to a top hat profile in the far field, which is at the focal length $f_L$ of lens L.

The refractive microlens arrays illustrated in FIG. 1 includes features (i.e., the microlenses) that are large in comparison to the wavelength of light. As a result, structure associated with these features is present in the semi-homogenized beam. Because some embodiments of the present invention utilize diffraction structures on the order of the wavelength of light, such larger structural nonuniformity is avoided in the homogenized output beams produced using embodiments of the present invention, resulting in greater beam uniformity and a reduction in intensity variations.

Figure 2:
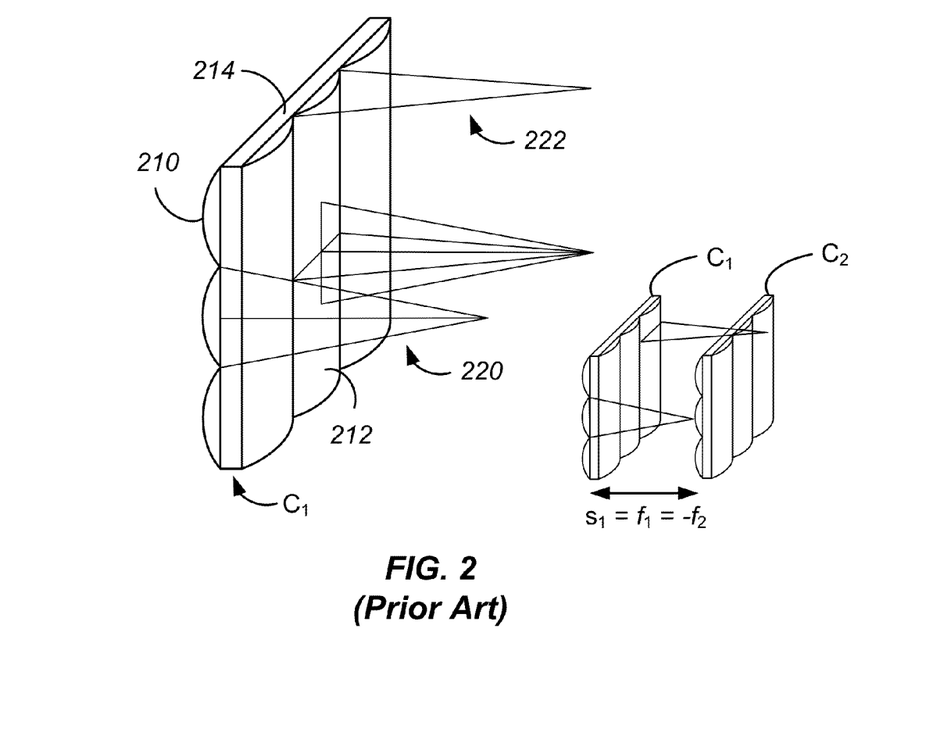
FIG. 2 is a simplified perspective drawing of a conventional crossed cylindrical lens beam homogenizer.

FIG. 2 is a simplified perspective drawing of a conventional crossed cylindrical lens beam homogenizer. The homogenizer illustrated in FIG. 2 utilizes two condensers $C_1$ and $C_2$. Each condenser, for example, condenser $C_1$ includes refractive, plano-convex, cylindrical lens arrays 210 and 212 with parabolic lens profiles. The cylindrical lenses 210 and 212 are mounted on either side of a central glass plate 214. Light is focused by the first linear array of cylindrical lenses 210 at a distance $f_1$ as illustrated by light rays 220. Light is focused in an orthogonal dimension by the second linear array of cylindrical lenses 212 with a focal distance $f_2$ as illustrated by light rays 222. A second condenser $C_2$ with matching sets of cylindrical lens arrays is positioned at a focal distance from the first condenser.

Despite the availability of microlens array and crossed cylindrical lens beam homogenizers, there is a need in the art for improved methods and systems for homogenizing laser beams in high power laser applications.

SUMMARY OF THE INVENTION

The present invention relates generally to laser systems. More particularly, the present invention relates to a method and system for homogenizing a high power laser beam. Merely by way of example, the method and apparatus have been applied to a diffractive photo-thermo-reflective glass member providing phase modification to a laser beam to provide an output with a substantially uniform intensity profile. Additionally, methods of fabricating large diffractive optical elements are provided by embodiments of the present invention. It will be recognized that the invention has a much broader range of applicability and can be applied to other laser systems.

According to an embodiment of the present invention, an optical system is provided. The optical system includes a diffractive optical element disposed along a beam path and having an input surface, an output surface opposing the input surface, and a predetermined thickness extending between the input surface and the output surface. The diffractive optical element includes a photo-thermo-refractive material and a laser beam intensity profile at the input surface is characterized by a first intensity profile. The optical system also includes a lens disposed along the beam path a predetermined distance from the output surface and operable to receive a laser beam exiting the output surface. A laser beam intensity profile at a surface of the lens is characterized by a second intensity profile. The optical system also includes a propagation path extending from the lens to a target position along the beam path. A laser beam intensity profile at the target position is characterized by a third intensity profile varying less than 10%.

According to another embodiment of the present invention, a method of manufacturing a plurality of diffractive optical elements is provided. The method includes providing a partially transmissive slide, providing a first piece of PTR glass, and directing first UV radiation through the partially transmissive slide to impinge on the first piece of PTR glass. The method also includes exposing predetermined portions of the first piece of PTR glass to the first UV radiation and thermally treating the exposed first piece of PTR glass. The method further includes providing a second piece of PTR glass and directing second UV radiation through the thermally treated first piece of PTR glass to impinge on the second piece of PTR glass. The method additionally includes exposing predetermined portions of the second piece of PTR glass to the second UV radiation, thermally treating the exposed second piece of PTR glass. Moreover, the method includes repeating providing and processing of the second piece of PTR glass using additional pieces of PTR glass.

According to yet another embodiment of the present invention, a method of fabricating a plurality of diffractive optical elements is provided. The method includes providing a master plate characterized by a predetermined phase profile as a function of position and providing a plurality of pieces of PTR glass. The method also includes a) directing UV radiation through the master plate to impinge on a first of the plurality of pieces of PTR glass, b) exposing predetermined portions of the first of the plurality of pieces of PTR glass to the UV radiation, and c) thermally treating the exposed first of the plurality of piece of PTR glass to form a first diffractive optical element. The method further includes repeating steps a) through c), sequentially substituting others of the plurality of pieces of PTR glass for the first of the plurality of piece of PTR glass to form other diffractive optical elements.

Many benefits are achieved by way of the present invention over conventional techniques. For example, the present technique provides diffractive plates that can be used to homogenize laser illumination, leading to higher extraction efficiency from laser gain materials and better beam quality from laser pumped lasers. Additionally, the diffractive plates provided herein provide improved uniformity of laser flux for target machining applications (which translates to pressure and temperature) using high average power diode pumped solid state lasers. Moreover, other embodiments provide inherently higher diffraction efficiency due to the smooth and continuous refractive index variation provided in comparison with etched or blazed optics. Since the diffractive effects are present in the bulk of the material, the surface of the optics described herein can be completely smooth. A smooth surface is conducive to high damage thresholds for the surface as well as any dielectric coatings that are applied to the surface. A smooth surface can also be kept clean versus conventional diffractive optics which act as a "getter" for contamination in vacuum and dirty environments. These and other embodiments of the invention along with many of its advantages and features are described in more detail in conjunction with the text below and attached figures.

DETAILED DESCRIPTION OF SPECIFIC EMBODIMENTS

Embodiments of the present invention are useful in a wide variety of laser applications. For example, the Laser Inertial Confinement Fusion-Fission Engine (LIFE) project described in International Patent Application No. PCT/US2008/011335, filed on Sep. 30, 2008, and entitled "Control of a Laser Inertial Confinement Fusion-Fission Power Plant," the disclosure of which is hereby incorporated by reference in its entirety for all purposes. The LIFE project will utilize lasers characterized by flat top intensity profiles in the far field. Additionally, Ti:Sapphire based, short pulse laser systems can benefit from homogenization of the beam of the pump laser in order to improve system efficiency and beam quality in the Ti:Sapphire output beam. Other diode pumped solid state laser applications such as laser machining, marking, drilling, and welding can also benefit from embodiments of the present invention based on improvements in the uniformity of the laser beam at the position of the target.

Although diode pumped solid state lasers enable high efficiency and high average power, the near and far field beam quality can still be unsatisfactory for several important laser applications, including pumping other lasers, machining, laser shock generation, and laser ablation. Several methods have been employed to improve the beam quality of such high power lasers.

As an example, some high power laser systems have used a phase corrector or adaptive optics to compensate for phase inhomogeneity in the beam, thereby enabling a diffraction limited focus. An adaptive mirror with multiple controllable tiles disposed in an array configuration is an example of an adaptive optics technique. Although adaptive optics techniques have demonstrated some success in decreasing laser spot size, these techniques do not provide a flat intensity profile at the focal point. Additionally, these techniques typically do not decrease the spatial inhomogeneity in the near field.

Another approach is to use diffractive elements to replace the microlenses and cylindrical lenses illustrated in FIG. 1 and FIG. 2, respectively. A drawback of this approach is that these elements utilize multi-exposure photolithography and etching processes or use a magneto-rheological polisher to achieve the surface structure necessary for desired performance. Using multi-exposure photolithography, precise mask alignment and etching processes are required to achieve high transmission efficiency, resulting in a time consuming fabrication process and expensive components. The inventors have determined that in addition to diffractive optics being difficult and expensive to manufacture, scaling of this approach to large apertures is expensive.

Figure 3:
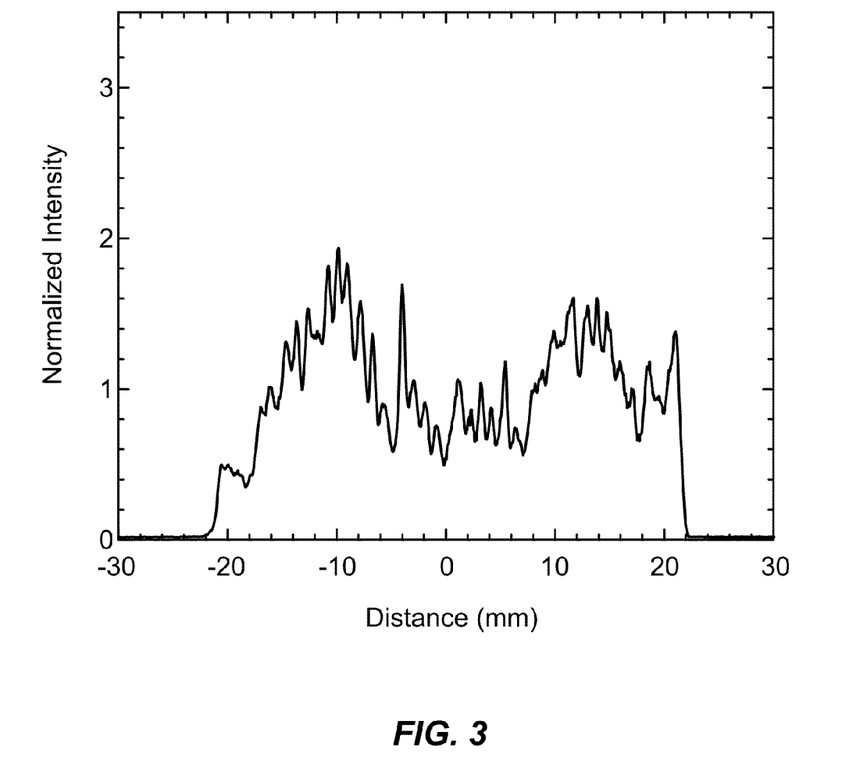
FIG. 3 is a simplified plot of laser intensity as a function of position for a representative laser beam.

FIG. 3 is a simplified plot of laser intensity as a function of position for a representative laser beam. As illustrated in FIG. 3, the intensity of the beam in the near field varies as a function of position in a non-periodic manner. The non-uniform spatial intensity profile characteristic of the near field of the laser beam shown in FIG. 3 results in a far field for the laser beam that will not focus to a diffraction limited spot. Typically, the far field will be multi-peaked. A number of important laser applications, including pumping other lasers, machining, laser shock generation, and laser ablation benefit when the spatial profile of the laser beam in either the near field or the far field is a flat spatial profile. As described more fully throughout the present specification, embodiments of the present invention reduce the beam non-uniformity and provide a substantially uniform (i.e., flat) spatial profile appropriate for these applications.

Figure 4:
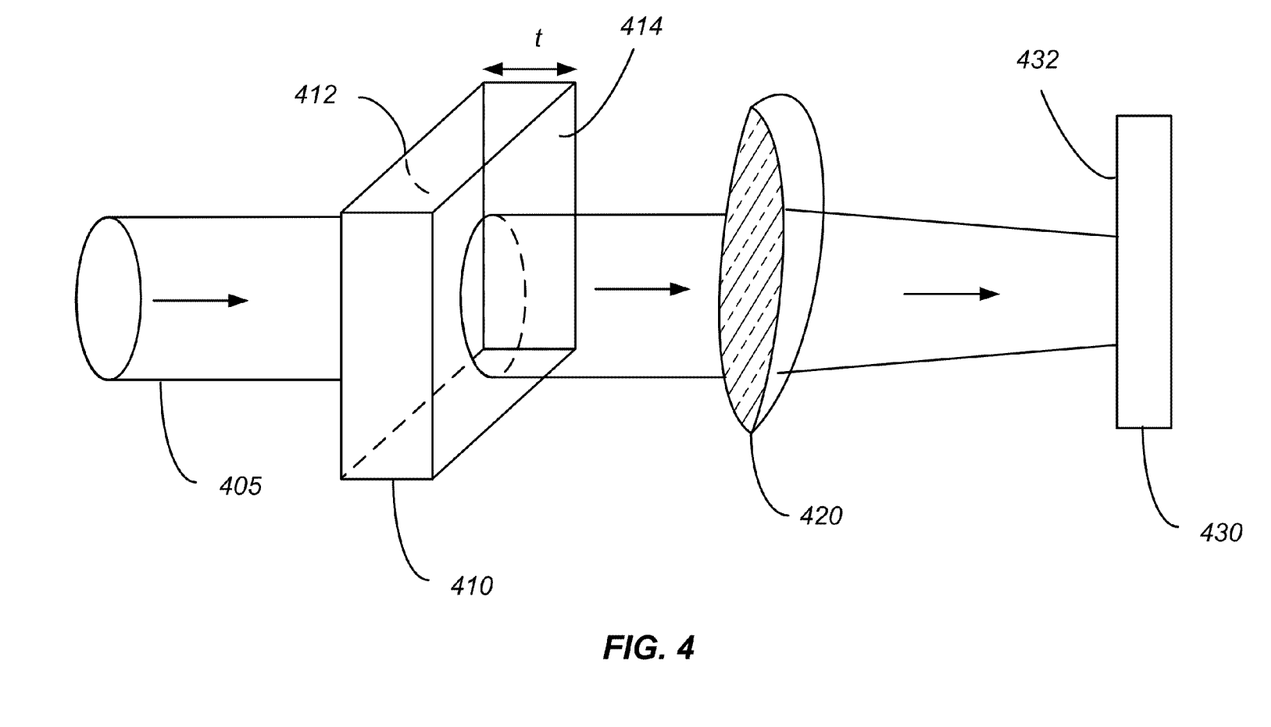
FIG. 4 is a simplified schematic diagram of a laser beam homogenization system according to an embodiment of the present invention.

FIG. 4 is a simplified schematic diagram of a laser beam homogenization system according to an embodiment of the present invention. The system 400 includes a diffractive optical element 410 disposed in the optical path of laser beam 405. The diffractive optical element 410 is also referred to as a diffractive homogenizer. The laser beam illustrated in FIG. 4 can be the near field of a laser output or after propagation through one or more optics. The laser beam 405 has a circular cross-section in the embodiment illustrated in FIG. 4, but this is not required by the present invention. The diffractive optical element has a first surface 412 facing the input beam, a second surface 414 opposing the first surface and a thickness t. The beam profile at first surface 412 is characterized by a predetermined phase profile. Additional discussion related to the predetermined phase profile at first surface 412 is provided in relation to FIGS. 5A and 5B.

The surfaces 412 and 414 of the diffractive optical element 410 are substantially planar and suitable for the deposition of anti-reflection (AR) coatings or other surface treatments. In the illustrated embodiment, the diffractive optical element is produced in the form of a rectangular parallelepiped. The diffractive optical element 410 is fabricated using a UV-based exposure and heat treatment process as described more fully throughout the present specification. The use of PTR glass, or other suitable transparent material that is able to provide a varying index of refraction as a function of position, enables the fabrication and use of a diffractive optical element with a continuous variation in refractive index as a function of position. Essentially, diffractive homogenizers vary the phase on a spatial scale which is small relative to the diode illumination non-uniformity. This is in contrast to conventional etched diffractive homogenizers in which discontinuities in the surface features result in an index of refraction that changes discontinuously.

The phase variation needed for the diffractive optical element can be exactly calculated on a computer, thereby generating a spatial phase map of the intended optic. From this calculation, the required index variation needed to achieve the required phase variation is $\Delta n = \phi/t$, wherein $\Delta n$ is the change in the index of refraction, $\phi$ is the required phase, and t is the thickness of the PTR glass. The refractive index change produced in the PTR is typically proportional to the incident light intensity during exposure.

PTR glass has been used to fabricate volume Bragg gratings for use in wavelength division multiplexing systems. These volume Bragg gratings are either periodic or chirped depending on the particular application and are fabricated by exposure using lasers as is typical with grating structures. Embodiments of the present invention contrast with these conventional grating structures formed in PTR since the pattern is not periodic or chirped, but defined based on the particular intensity profile present at the input face of the diffractive optical element and the desired intensity profile at the optical gain medium. Referring to FIG. 4, the index of refraction profile in the diffractive optical element is thus defined in terms of the intensity profile at surface 412 and the desired uniform intensity profile at surface 432. In contrast with a periodic grating structure, even a chirped grating structure, embodiments of the present invention utilize a non-sinusoidal index of refraction profile to achieve the desired diffraction effects.

Etched diffractive structures have a number of drawbacks that present problems for use in high power laser applications. The shape of the etched surface results in diffraction effects as a laser beam passes through the diffractive optical element. In order to control the surface feature, a high level of control is needed over the registration of one level of the etch mask to the other levels of the etch mask. Misalignment of the etch mask results in mis-defined surface shapes, thereby reducing the quality of the transmitted beam. Also, the etch depth control is a critical input into the final surface profile. For an 8-level etch process with the total height of the diffraction feature being about 1 μm, the final step height is 250 nm, which is difficult to etch with a high level of repeatability.

Assuming that adequate control is exercised over etch mask alignment and etch depth, the sharp features in etched diffraction structures result in scattering of incident light, adversely impacting the transfer efficiency of the diffractive optical element. Studies performed by the inventors utilizing etched diffractive structures have demonstrated transfer efficiencies (light out divided by light in) of about 60% after passage through an anamorphic telescope, the etched diffractive homogenizer, a focusing lens, and a mirror. Scattering losses from optical elements are typically reduced through the use of thin film anti-reflection (AR) coatings. However, the highly structured surface of etched diffraction structures adversely impacts the availability and quality of thin-film coatings. Thus, in some etched diffractive optical elements, Fresnel reflection losses at interfaces can make a significant contribution to reductions in power transfer efficiency.

Embodiments of the present invention reduce or eliminate the shortcomings of etched diffractive homogenizers. The planar surfaces associated with diffractive optical elements made using PTR glass are well-suited to high-power laser applications. Because the surfaces of the optic are flat, collection of dirt and dust, common with etched surfaces, is reduced. Additionally, the flat surfaces provide a substrate suitable for deposition of AR coatings, reducing Fresnel reflection losses at interfaces. The flat surfaces and "internal" index variations provided by the diffractive optical elements described herein result in much higher transfer efficiencies than those associated with etched diffraction structures. In contrast with a 16-level binary plate tested by the inventors, which was characterized by a transfer efficiency of about 80%, embodiments of the present invention provide transfer efficiencies of >90%, >92%, >94%, >96%, or >98%.

Additionally, scattering losses in diffractive optical elements fabricated in PTR glass are reduced in comparison with conventional etched diffraction elements. The continuous variation in index of refraction that results from the fabrication methods described herein eliminates discontinuities that are present in etched structures, thereby increasing the transfer efficiency of diffractive optical elements fabricated in PTR glass.

As described above, conventional etched diffractive optics are limited in their transfer efficiency as a result of the etching process by which they are made. Utilizing embodiments of the present invention, it is possible to create a grayscale master slide utilizing techniques including those developed for semiconductor lithography and fabricate diffractive optical elements in PTR glass that have continuous variations in refractive index. Printing and imaging techniques developed at significant cost for lithography can be leveraged such as image relay, step and repeat, and the like. The smooth phase profiles in these diffractive optical elements will thus be much more efficient that conventional plates.

Embodiments of the present invention will be applicable to numerous high-power laser and amplifier applications. As an example, the LIFE program being developed at Lawrence Livermore National Laboratory, will utilize high power laser beams and will benefit from the ability to deliver homogeneous light to the amplifiers. Homogenous illumination of the amplifiers will enable high beam quality and high efficiency. Additionally, large aperture lasers useful for defense applications could also benefit from homogenous pumping to increase beam quality, which also increases the laser intensity on target for tactical warfare. Other solid state laser applications, such as laser machining, marking, drilling, and welding could also benefit from embodiments of the present invention by way of improved output energy and beam quality.

Light passes through the diffractive optical element 410 and is then focused with a lens 420. The lens is shown in a cut-away view in order to represent a positive lens. The homogenized beam is imaged at plane 432 of optical amplifier 430, where the far field of the lens would normally be located. It should be noted that the spatial scale of the phase variation in the diffractive optical element will determine if a far field or near field flat-top intensity profile is generated. If the phase profile of the diffractive optical element is slowly varying in the direction normal to the direction of propagation of the laser beam, then, after diffraction through free space, a far field flat-top intensity profile will be produced. This can be compared to a sync profile associated with the far field of a laser beam. On the other hand, if the phase profile of the diffractive optical element is varying rapidly in the direction normal to the propagation of the laser beam, then after diffraction through free space, a near field flat-top intensity profile will be produced. The inventors have determined that the rapidly varying phase profile, which can be fabricated using embodiments of the present invention and PTR glass, cannot be fabricated using magneto-rheological finishing because the feature sizes available using magneto-rheological finishing are larger than the variations in the phase profile. Thus, the present invention provides fabrication techniques that are not available using conventional methods.

The optical amplifier 430 can be an amplifier slab for high-power amplifier or an active component of laser. The design of the diffractive optical element 410 will be tailored to the intensity profile characterizing the input laser beam 405 at the input of the diffractive optical element. After propagation through the diffractive optical element and imaging using lens 420, the spatially dependent illumination characterizing the input beam will be randomized, creating a homogenized beam for pumping of the amplifier slab 430 or other suitable gain media. The shape of the beam (measured in cross-section) can be varied using the diffractive optical element 410. As an example, a square or rectangular beam cross section from a pre-amplifier stage could be maintained at the amplifier slab 430 or converted to a round beam at the amplifier slab 430.

The diffractive optical element can also perform imaging of the beam in addition to homogenization. Thus, in addition to or in place of lens 420, additional lensing effects can be provided by the diffractive optical element. Although a single lens 420 is illustrated in FIG. 4, embodiments of the present invention are not limited to a single lens and additional optical elements can be used to provide imaging effects. One of ordinary skill in the art would recognize many variations, modifications, and alternatives.

Embodiments of the present invention are useful in improving the uniformity of the beam at the target location in solid state laser applications, including laser machining, marking, drilling, welding, and the like. The diffractive optical elements described herein can be used to homogenize laser illumination, leading to higher extraction efficiency from laser gain media and better beam quality in laser pumped lasers. Additionally, embodiments provide for improved uniformity of laser flux in target machining applications (which translates into pressure and temperature) using high average power diode pumped solid state lasers. Additionally, short pulse lasers and other laser pumped lasers can benefit from the near field homogenization provided by the embodiments described herein in terms of improvement in laser beam quality and efficiency of gain extraction in the laser.

Figure 5A:
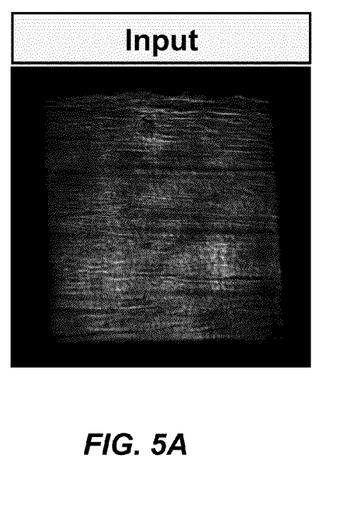
FIG. 5A is a simplified image of laser beam intensity as a function of position at an input of the diffractive optical element according to an embodiment of the present invention.

FIG. 5A is a simplified image of laser beam intensity as a function of position at an input of the diffractive optical element according to an embodiment of the present invention. As shown in FIG. 5A, the intensity of the laser varies greatly as a function of position. The intensity profile is characterized by varying power as a function of position with some regions of the beam much brighter than other regions. In fact, several portions of the laser beam appear almost black, indicating low amounts of power at these portions of the beam.

In this example, the light from the laser has propagated a given distance and diffraction and propagation have resulted in the illustrated non-uniform intensity profile. If this intensity profile were imaged onto an amplifier slab, then the gain in the amplifier slab would be characterized by areas of high gain and areas of low gain, resulting in inefficient pumping of the gain medium in the amplifier. Moreover, the variation in the beam intensity will result in unpredictable gain profiles in the amplifier, adversely impacting system performance.

Figure 5B:
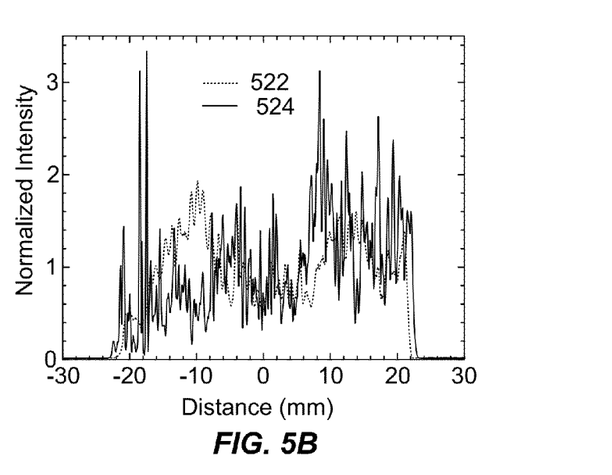
FIG. 5B includes simplified plots of laser beam intensity as a function of position at the input of the diffractive optical element according to an embodiment of the present invention.

FIG. 5B includes simplified plots of laser intensity as a function of position at the input of the diffractive optical element according to an embodiment of the present invention. An intensity profile taken along a horizontal direction is illustrated by dashed line 522 representing the width of the input beam and an intensity profile taken along a vertical direction is illustrated by solid line 524 representing the height of the input beam. As illustrated in FIG. 5A, the measurement along the width (dashed line 522) is characterized by an approximately bimodal distribution with peaks at the edge regions and a decrease in intensity at the middle of the profile. The measurement along the height (solid line 524) is characterized by the majority of power in the upper portion of the beam, with low intensity in the central in lower regions. A spike at the lower edge of the beam is visible in the laser intensity plot.

The intensity variation across the laser beam is large, with some of the intensity spikes being more than three times larger than other intensity values. Referring to solid line 524 associated with a vertical measurement through the beam, the spikes at about −20 mm have a normalized intensity value greater than three, whereas the intensity at about −10 mm is less than one. For dashed line 522, which has an average normalized intensity value of around one, some peaks reach about twice that value, with troughs down to about half that value. Thus, variations in the intensity can be greater than 100%. As discussed in relation to FIG. 5A, a laser beam with the intensity profile as illustrated in FIG. 5B will result in poor performance when used as a pump beam or for other high-power applications. Focusing of the input beam illustrated in FIGS. 5A and 5B will result in a non-diffraction limited spot, with significant amounts of power in higher-order lobes. Thus, the power on target will be far less than available had the input beam been uniform.

Figure 5C:
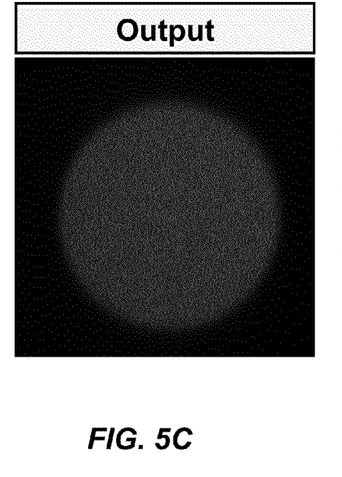
FIG. 5C is a simplified image of laser beam intensity as a function of position at an output of the diffractive optical element according to an embodiment of the present invention.

FIG. 5C is a simplified image of laser beam intensity as a function of position at an output of the diffractive optical element according to an embodiment of the present invention. In referring to the laser beam intensity at the output of the diffractive optical element, this does not require the output beam to be positioned at a surface of the diffractive optical element, but can be understood as the beam at an output position spaced apart from the diffractive optical element. Referring to FIG. 4, the output beam may be positioned at surface 432 of the amplifier slab 430. The laser beam has been converted from a generally rectangular beam shape into a circular beam. Conversion of the beam shape is not required by embodiments of the present invention, but can be provided as illustrated in this figure. As illustrated in FIG. 5C, the image of laser beam intensity shows a uniform intensity pattern as a function of position, which is desirable for many applications.

Figure 5D:
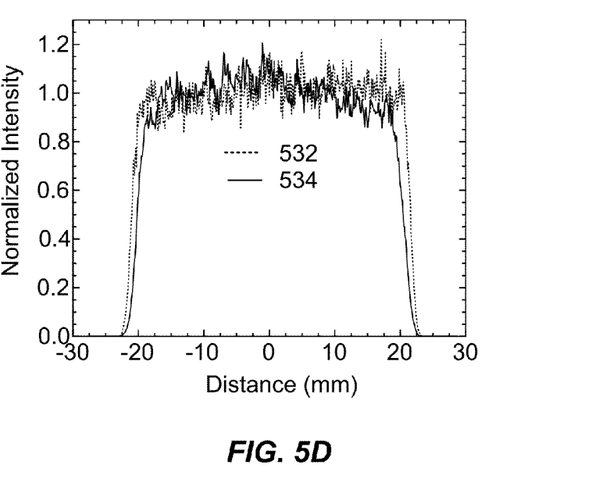
FIG. 5D includes simplified plots of laser beam intensity as a function of position at the output of the diffractive optical element according to an embodiment of the present invention.

FIG. 5D includes simplified plots of laser intensity as a function of position at the output of the diffractive optical element according to an embodiment of the present invention. The laser intensity as a function of position across the circular beam is illustrated by dashed line 532 and solid line 534. The intensity profile taken along the horizontal direction is illustrated by dashed line 532 and the intensity profile taken along the vertical direction is illustrated by solid line 534. In comparison with FIG. 5B, the intensity profiles in both the horizontal and vertical directions are substantially uniform, with only minor variations as a function of position. Utilizing the diffractive optical element provides an intensity variation of less than 20% across the beam, less than 15%, less than 10%, less than 5%, less than 4%, less than 3%, less than 2%, or less than 1%, depending on the particular design criteria for the diffractive optical element.

Figure 6:
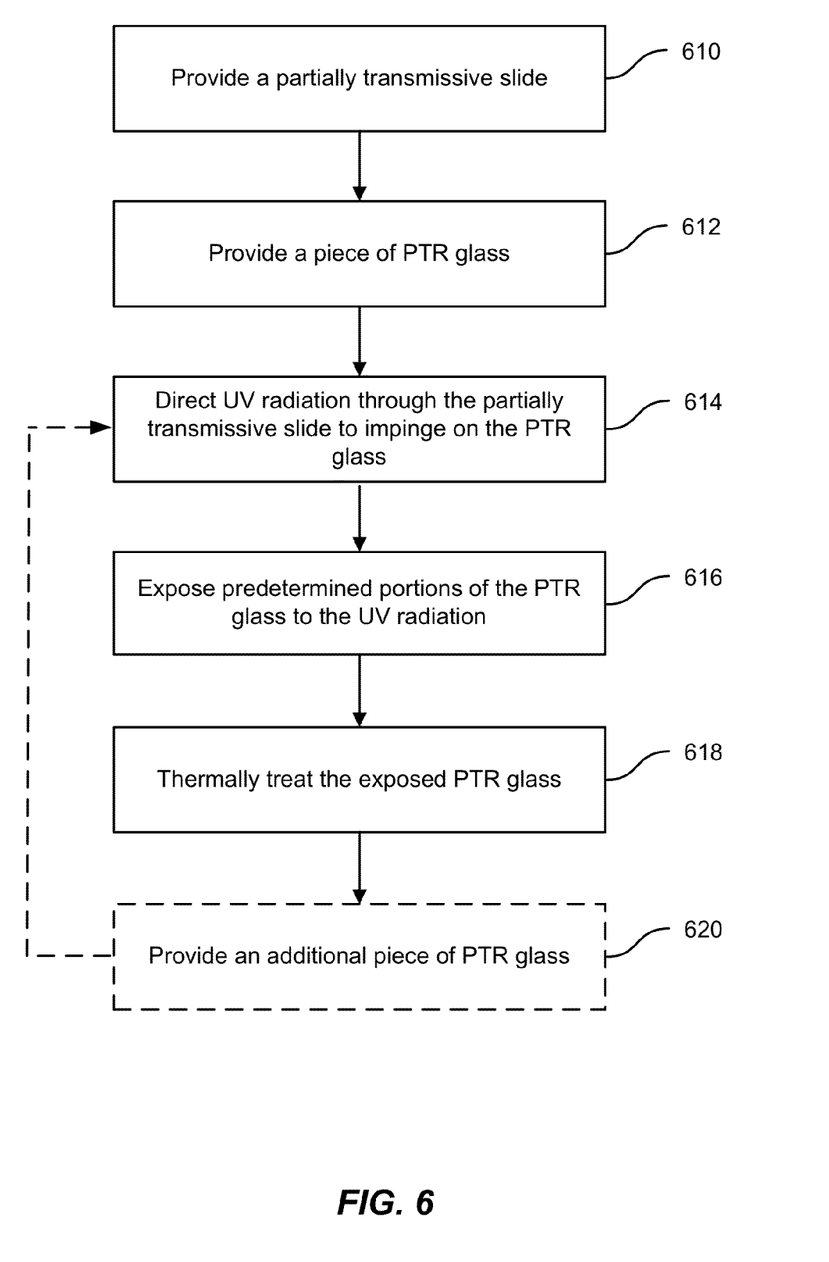
FIG. 6 is a simplified flowchart illustrating a method of fabricating a diffractive optical element according to an embodiment of the present invention.

According to embodiments of the present invention, diffractive optical elements (such as beam homogenizers) are manufactured by using a master plate having either an intensity or phase variation and imaging a predetermined intensity profile on a photorefractive glass substrate, thereby creating a new diffractive optical element with a single exposure. FIG. 6 is a simplified flowchart illustrating a method of fabricating a diffractive optical element according to an embodiment of the present invention. In the method illustrated in FIG. 6, one or more diffractive optical elements can be fabricated for use in homogenization of light from a diode laser pump array or a laser beam. The method includes providing a partially transmissive slide (610) and a piece of PTR glass (612). The partially transmissive slide may be a photographic image suitable for use in grayscale photolithographic techniques. Using such a photographic image, shades of gray can be utilized to produce continuous index of refraction changes as a function of position in the PTR glass. Based on computations of the desired index of refraction as a function of position in the PTR glass, the density of the partially transmissive slide, and the intensity of the illumination of the PTR glass as a result, will vary according to the amount of light to be exposed on the various portions of the PTR glass.

The method also includes directing UV radiation through the partially transmissive slide to impinge on the PTR glass (614). The intensity pattern is a predetermined pattern as appropriate to the desired index of refraction pattern in the PTR glass. Predetermined portions of the PTR glass are exposed to UV radiation (616) and the exposed PTR glass is thermally treated to produce the desired index of refraction profile as a function of position. Some embodiments of the present invention provide a continuous variation in index of refraction as a function of position. The smoothly varying phase profile provided by these diffractive optical elements enables higher transfer efficiency in generating the desired uniform beam profile.

Another method that can be used to create the desired intensity profile on the PTR glass is to use a spatial light modulator to block portions of the UV beam and to create a continuously varying intensity pattern on the PTR glass. Image relay techniques utilized as a part of photolithographic processes can be utilized to magnify or demagnify images produced by either use of a partially transmissive slide or use of a spatial light modulator. As an example, for large aperture optics suitable for use in the LIFE program, the methods described herein can be scaled using a stepper to properly register one exposure site to the next, thereby timing together a complete large area diffractive optical element. As described more fully in relation to FIG. 7, a large area master plate fabricated using a tiling process can then be used to create duplicate plates utilizing a single exposure.

Diffractive optical elements fabricated in PTR glass are also more robust than conventional etched diffraction structures. The flat surfaces of the diffractive optical elements provided according to embodiments of the present invention are much more difficult to damage than etched structures with fine features.

As an optional method, an additional piece of PTR glass can be provided (620). Using the same partially transmissive slide, UV radiation can be directed through the partially transmissive slide to impinge on the additional piece of PTR glass. Portions of the additional piece of PTR glass will be exposed to the UV radiation and the exposed PTR glass will then be thermally treated to provide a second diffractive optical element. This optional path can be performed multiple times. Utilizing this optional process, multiple diffractive optical elements can be fabricated using a single partially transmissive slide as a master slide. For large area optics, the partially transmissive slide can be fabricated using a step and repeat process based on smaller sections of partially transmissive media. Thus, the disclosed methods of fabricating diffractive optical elements, including spatial beam homogenizers for diode laser arrays and laser beams, enables low-cost mass production at a scale limited only by the size of the substrate (e.g., PTR glass substrate).

It should be appreciated that the specific steps illustrated in FIG. 6 provide a particular method of fabricating a diffractive optical element according to an embodiment of the present invention. Other sequences of steps may also be performed according to alternative embodiments. For example, alternative embodiments of the present invention may perform the steps outlined above in a different order. Moreover, the individual steps illustrated in FIG. 6 may include multiple substeps that may be performed in various sequences as appropriate to the individual step. Furthermore, additional steps may be added or removed depending on the particular applications. One of ordinary skill in the art would recognize many variations, modifications, and alternatives.

Figure 7:
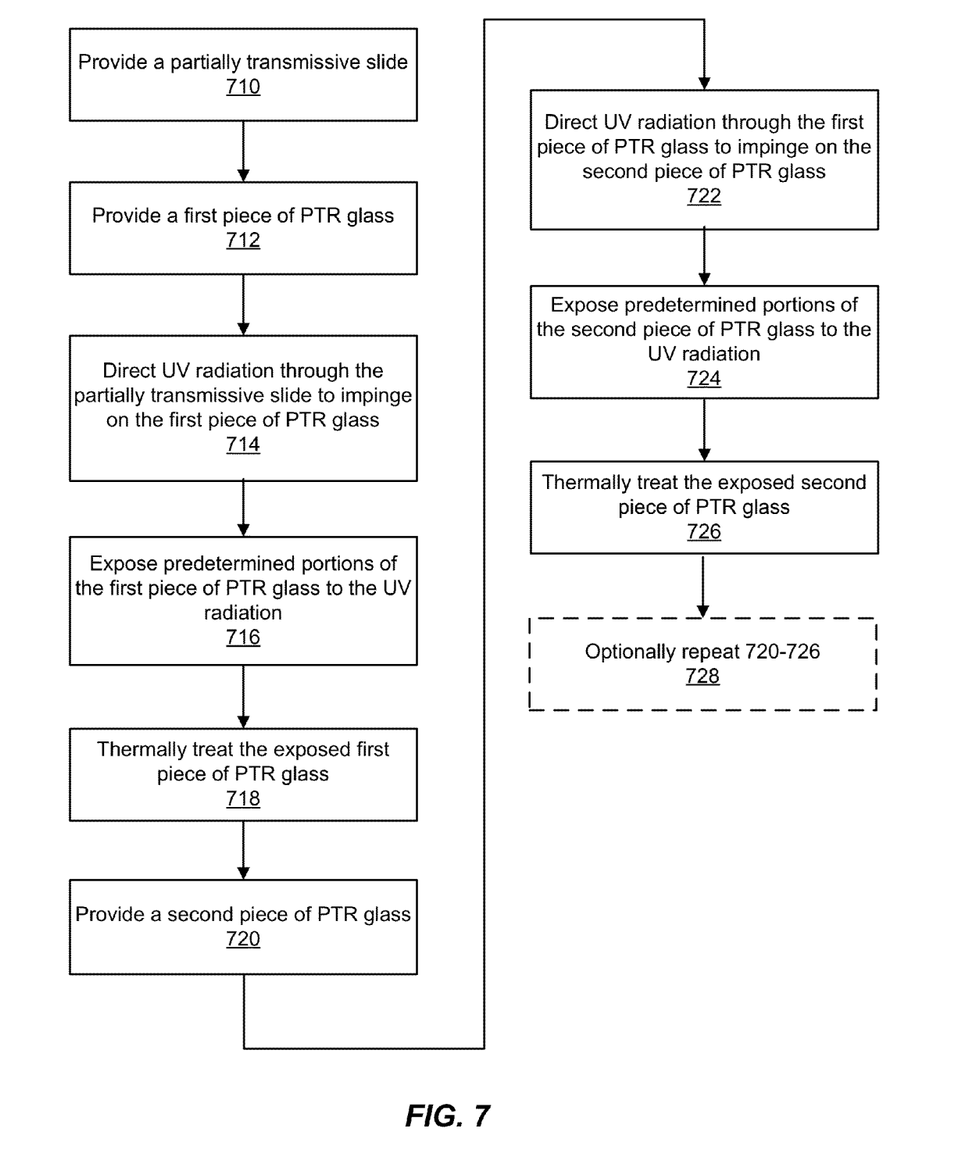
FIG. 7 is a simplified flowchart illustrating a method of fabricating diffractive optical elements according to another embodiment of the present invention.

FIG. 7 is a simplified flowchart illustrating a method of fabricating diffractive optical elements according to another embodiment of the present invention. The method includes providing a partially transmissive slide (710) and a first piece of PTR glass (712). As described below, the first piece of PTR glass will be processed and then used as a master plate in producing additional pieces of PTR glass for use as diffractive optical elements. The method also includes directing UV radiation through the partially transmissive slide to impinge on the first piece of PTR glass (714) and exposing predetermined portions of the first piece of PTR glass to the UV radiation (716).

In order to create the desired intensity pattern on the first piece of PTR glass, methods other than use of a partially transmissive slide may be utilized. For example, a two-dimensional spatial light modulator may be utilized to create a desired intensity pattern on the first piece of PTR glass thereby exposing predetermined portions of the first piece of PTR glass to UV radiation.

After the PTR glass is exposed, it is thermally treated to produce a predetermined index of refraction pattern as a function of position inside PTR glass (718). The first piece of PTR glass is provided with index of refraction pattern that, through diffraction, will produce a predetermined intensity profile at a specified imaging plane. Thus, a computation is included in embodiments of the method in order to produce an intensity pattern on the first piece of PTR glass that will result in an index of refraction pattern that will subsequently be used to produce a second intensity pattern as described more fully below.

Embodiments of the present invention can utilize several different methods to create the master plate. In order to generate the desired light intensity profile for the master plate, spatial light modulators, lithographic printing techniques, standard photolithographic etching techniques, magnetorheological finishing techniques, or the like can be used. After the master plate is fabricated, providing a phase plate with predetermined phase variation as a function of position across the plate, the master plate is used as a master for generating a nearly infinite number of duplicate plates, with the cost of the duplicate plate approaching that of the substrate used for the duplicate plate.

The method further includes providing a second piece of PTR glass (720) and directing UV radiation through the first piece of PTR glass to impinge on the second piece of PTR glass (722). The first piece of PTR glass is thus used as a master plate in a manner analogous to the use of the partially transmissive slide. It will be appreciated that the partially transmissive slide is used to create a predetermined intensity pattern on the first piece of PTR glass. In this embodiment of the present invention, the first piece of PTR glass is now used to create a second predetermined intensity pattern on the second piece of PTR glass. Diffraction of the UV radiation passing through the first piece of PTR glass is utilized to form the second predetermined intensity pattern. Additional optical elements may be utilized as part of the optical system in order to form the second predetermined intensity pattern. One of ordinary skill in the art would recognize many variations, modifications, and alternatives.

Predetermined portions of the second piece of PTR glass are exposed to the UV radiation passing through the first piece of PTR glass (724) and the second piece of PTR glass is thermally treated after exposure (726). Thus, the second piece of PTR glass includes an index of refraction profile as a function of position that is suitable for use as a diffractive optical element, for example, a diffractive homogenizer. In order to utilize the first piece of PTR glass as a master plate, processes 720-726 are optionally repeated with additional pieces of PTR glass to form additional diffractive optical elements. Thus, after fabrication of the initial master plate, multiple copies of the second piece of PTR glass can be fabricated easily and inexpensively in comparison with conventional techniques. As discussed in relation to FIG. 6, photolithographic techniques including image relay, magnification, demagnification, and the like, can be utilized during exposure of the PTR glass to UV radiation.

It should be appreciated that the specific steps illustrated in FIG. 7 provide a particular method of fabricating diffractive optical elements according to an embodiment of the present invention. Other sequences of steps may also be performed according to alternative embodiments. For example, alternative embodiments of the present invention may perform the steps outlined above in a different order. Moreover, the individual steps illustrated in FIG. 7 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 8:
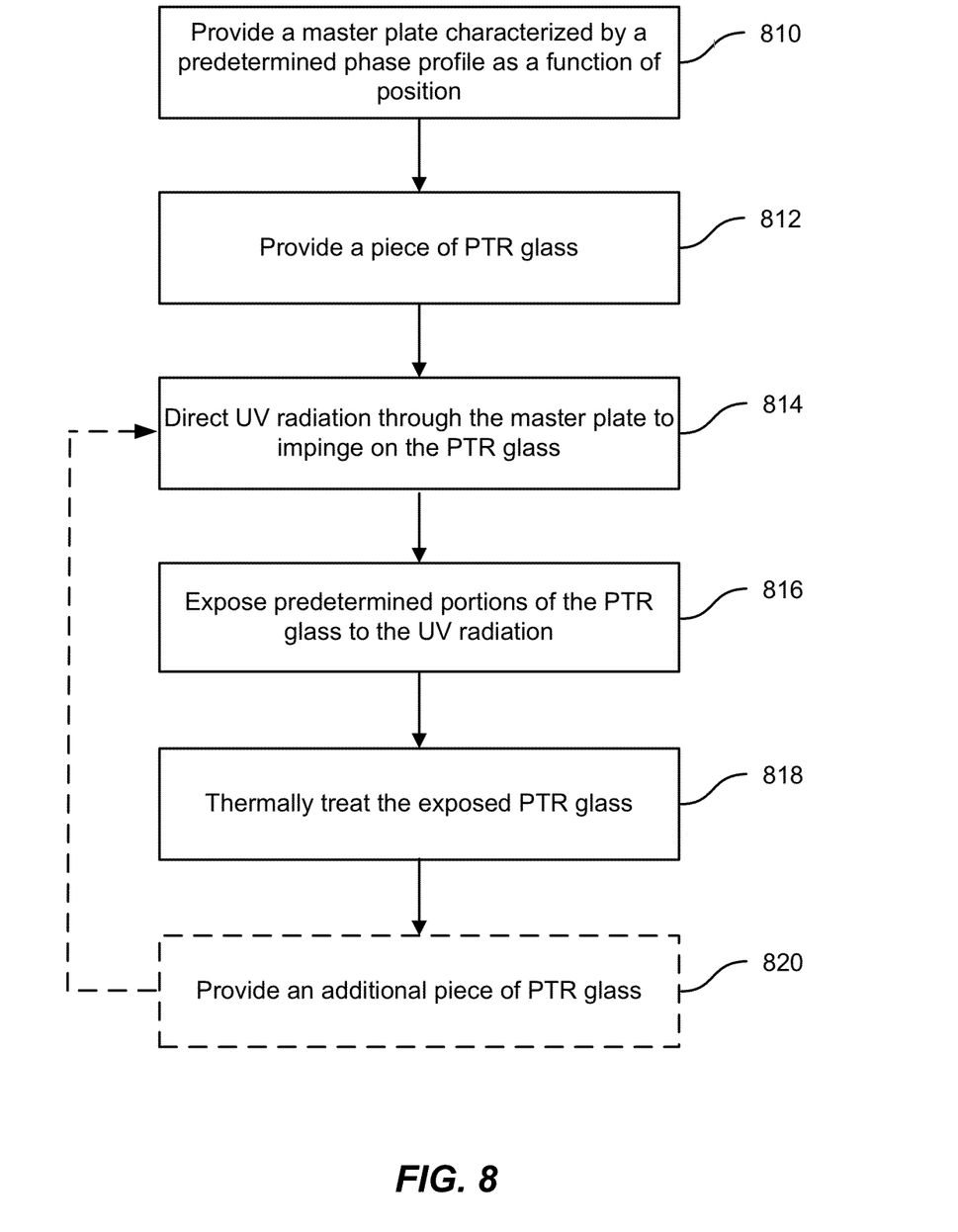
FIG. 8 is a simplified flowchart illustrating a method of fabricating diffractive optical elements using a master plate according to an embodiment of the present invention.

FIG. 8 is a simplified flowchart illustrating a method of fabricating diffractive optical elements using a master plate according to an embodiment of the present invention. The method includes providing a master plate characterized by a predetermined phase profile as a function of position (810). The master plate can be fabricated using PTR materials or may be a conventional multi-level etched diffractive element. The method also includes providing a piece of PTR glass (812) and directing UV radiation through the master plate to impinge on the PTR glass (814). The phase profile of the master plate is a predetermined phase profile that will cause light transmitted through the master plate to diffract and provide an intensity pattern at the piece of PTR glass.

The method further includes exposing predetermined portions of the PTR glass to the UV radiation (816) and thermally treating the exposed PTR glass to form a diffractive optical element (818). The methods illustrated in FIG. 8 share common features with those illustrated in FIGS. 6 and 7 and description associated with those figures is applicable to FIG. 8.

In order to fabricate additional diffractive optical elements, additional pieces of PTR glass are provided (820) and processes 814 through 818 are repeated to fabricate the additional diffractive optical elements. Utilizing a single phase-based master plate, a plurality of identical diffractive optical elements, with the cost of the diffractive optical elements approaching that of the substrate used during fabrication. Although the method illustrated in FIG. 8 utilizes a single exposure of the master plate during fabrication of the diffractive optical element, step and repeat methodologies may be utilized to fabricate diffractive optical elements larger than the master plate.

It should be appreciated that the specific steps illustrated in FIG. 8 provide a particular method of fabricating diffractive optical elements using a master plate according to an embodiment of the present invention. Other sequences of steps may also be performed according to alternative embodiments. For example, alternative embodiments of the present invention may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of manufacturing a plurality of optical elements, the method comprising:
providing a partially transmissive slide characterized by a predetermined intensity profile;

providing a first piece of photo-thermo-refractive (PTR) glass;
directing first UV radiation through the partially transmissive slide to impinge on the first piece of PTR glass with the predetermined intensity profile;
exposing predetermined portions of the first piece of PTR glass to the first UV radiation;
thermally treating the exposed first piece of PTR glass to form one of the plurality of optical elements having a first predetermined phase profile operable to generate a second predetermined intensity profile at a predetermined distance from the first piece of PTR glass;
providing a second piece of PTR glass at the predetermined distance;
directing second UV radiation through the thermally treated first piece of PTR glass to impinge on the second piece of PTR glass;
exposing predetermined portions of the second piece of PTR glass to the second UV radiation having the second predetermined intensity profile;
thermally treating the exposed second piece of PTR glass to form another of the plurality of optical elements having a second predetermined phase profile differing from the first predetermined phase profile, wherein the second predetermined phase profile is operable to modify a laser beam to produce a homogenized intensity profile; and
repeating providing and processing of the second piece of PTR glass using additional pieces of PTR glass to form a remainder of the plurality of optical elements having the second predetermined phase profile.

2. The method of claim 1 wherein the second piece of PTR glass is characterized by a continuous variation in index of refraction as a function of position.

3. The method of claim 1 wherein the first piece of PTR glass comprises a rectangular parallelepiped.

4. The method of claim 3 wherein the PTR glass comprises a rectangular parallelepiped and the first UV radiation impinges on the rectangular parallelepiped on a face normal to a smallest dimension of the rectangular parallelepiped.

5. The method of claim 1 wherein the second piece of PTR glass comprises a rectangular parallelepiped.

6. The method of claim 1 wherein the partially transmissive slide comprises a photographic image.

7. The method of claim 1 wherein the partially transmissive slide is characterized by a predetermined intensity profile as a function of position.

8. The method of claim 7 wherein the predetermined intensity profile as a function of position comprises a continuous variation in intensity as a function of position.

9. A method of fabricating a plurality of optical elements, the method comprising:
providing a PTR glass master plate characterized by a predetermined two-dimensional phase profile as a function of position, wherein the predetermined two-dimensional phase profile is operable to generate a predetermined two-dimensional intensity profile at a predetermined distance from the master plate;
providing a plurality of pieces of PTR glass;
a) directing UV radiation through the master plate to impinge on a first of the plurality of pieces of PTR glass positioned at the predetermined distance from the master plate;
b) exposing predetermined portions of the first of the plurality of pieces of PTR glass to the UV radiation having the predetermined two-dimensional intensity profile;
c) thermally treating the exposed first of the plurality of pieces of PTR glass to form a first optical element having a second predetermined two-dimensional phase profile as a function of position differing from the predetermined two-dimensional phase profile, wherein the second predetermined two-dimensional phase profile is operable to modify a laser beam to produce a homogenized intensity profile; and
repeating steps a) through c), sequentially substituting others of the plurality of pieces of PTR glass for the first of the plurality of piece of PTR glass to form other optical elements having the second predetermined two-dimensional phase profile as a function of position.

10. The method of claim 9 wherein the PTR glass is a rectangular parallelepiped.

11. The method of claim 9 wherein the PTR glass master plate is formed via exposure through a multi-level etched diffraction plate.

12. The method of claim 9 wherein the plurality of diffractive optical elements are characterized by a continuous variation in index of refraction as a function of position.

13. The method of claim 9 wherein the plurality of optical elements comprise homogenizers.

* * * * *